United States Patent
You et al.

(10) Patent No.: US 6,518,167 B1
(45) Date of Patent: Feb. 11, 2003

(54) METHOD OF FORMING A METAL OR METAL NITRIDE INTERFACE LAYER BETWEEN SILICON NITRIDE AND COPPER

(75) Inventors: Lu You, San Jose, CA (US); Matthew S. Buynoski, Palo Alto, CA (US); Paul R. Besser, Sunnyvale, CA (US); Jeremias D. Romero, Hayward, CA (US); Pin-Chin Connie Wang, Menlo Park, CA (US); Minh Q. Tran, Milpitas, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/123,588

(22) Filed: Apr. 16, 2002

(51) Int. Cl.⁷ .................... H01L 21/4763; H01L 21/44
(52) U.S. Cl. ............... 438/622; 438/643; 438/672; 438/680; 438/686
(58) Field of Search ................. 438/639, 687, 438/693, 672, 688, 680, 686, 622, 674; 257/751, 762, 767, 746, 764

(56) References Cited

U.S. PATENT DOCUMENTS

| | | |
|---|---|---|
| 5,191,099 A | 3/1993 | Gladfelter et al. |
| 5,429,989 A * | 7/1995 | Fiordalice et al. ......... 438/648 |
| 5,639,691 A | 6/1997 | Klein et al. |
| 5,659,057 A * | 8/1997 | Vaartstra .................. 556/51 |
| 6,017,818 A * | 1/2000 | Lu ........................... 438/653 |
| 6,077,768 A * | 6/2000 | Ong et al. ................ 438/622 |
| 6,077,781 A * | 6/2000 | Guo et al. ................ 438/688 |
| 6,081,034 A * | 6/2000 | Sandhu et al. ........... 257/764 |
| 6,203,613 B1 * | 3/2001 | Gates et al. .............. 117/104 |
| 6,204,172 B1 * | 3/2001 | Marsh ..................... 438/653 |
| 6,271,595 B1 | 8/2001 | McGahay et al. |
| 6,351,036 B1 * | 2/2002 | Stumborg et al. ........ 257/751 |
| 6,372,518 B1 * | 4/2002 | Nasu et al. .................. 438/3 |
| 6,376,349 B1 * | 4/2002 | Tobin et al. .............. 438/592 |
| 6,403,414 B2 * | 6/2002 | Marsh ..................... 438/239 |

\* cited by examiner

Primary Examiner—Michael S. Lebentritt
(74) Attorney, Agent, or Firm—Foley & Lardner

(57) ABSTRACT

A method of forming a metal or metal nitride layer interface between a copper layer and a silicon nitride layer can include providing a metal organic gas or metal/metal nitride precursor over a copper layer, forming a metal or metal nitride layer from reactions between the metal organic gas or metal/metal nitride precursor and the copper layer, and depositing a silicon nitride layer over the metal or metal nitride layer and copper layer. The metal or metal nitride layer can provide a better interface adhesion between the silicon nitride layer and the copper layer. The metal layer can improve the interface between the copper layer and the silicon nitride layer, improving electromigration reliability and, thus, integrated circuit device performance.

20 Claims, 1 Drawing Sheet

METHOD OF FORMING A METAL OR METAL NITRIDE INTERFACE LAYER BETWEEN SILICON NITRIDE AND COPPER

CROSS REFERENCE TO RELATED APPLICATIONS

This application is related to U.S. patent application Ser. No. 10/145,944, entitled METHOD OF FORMING AN ADHESION LAYER WITH AN ELEMENT REACTIVE WITH A BARRIER LAYER, filed on an even date herewith by Lopatin, et al. and assigned to the same assignee as this application.

FIELD OF THE INVENTION

The present invention relates generally to integrated circuits and methods of manufacturing integrated circuits. More particularly, the present invention relates to forming a metal interface layer between silicon nitride and copper.

BACKGROUND OF THE INVENTION

In general, as semiconductor devices or integrated circuits have become smaller, the corresponding current densities across the metal conductors in the devices have increased. Metal conductors typically have an upper current density limit imposed by the phenomenon of electromigration. For example, aluminum conductors experience electromigration problems at current densities of approximately $10^5$ amperes per square centimeter (A/cm$^2$).

Electromigration refers to the transport of mass in metals due to the electric current. Electromigration is caused by the transfer of momentum from the electrons associated with the electric current to the positive metal ions. When a significant amount of current passes through thin metal conductors in semiconductor devices or integrated circuits, the metal ions associated with thin metal conductors are transported and tend to accumulate in some regions and be removed from other regions. The accumulation or pileup of the metal ions can short circuit adjacent conductors in the device. The removal of metal ions in other regions may create voids which result in an open circuit. Short circuits and open circuits caused by electromigration often result in device failure.

Electromigration failures have been described by Stanley Wolf, Ph.D. in Silicon Processing for the VLSI Era, Lattice Press, Sunset Beach, Calif., Vol. 2, pp. 264–65 (1990). Dr. Wolf explains that a positive divergence of the motion of the ions of a conductor leads to an accumulation of vacancies, forming a void in the metal. Such voids may ultimately grow to a size that results in open-circuit failure of the conductor line.

Integrated circuits typically include multiple layers of conductive lines separated by dielectric layers. These layers of conductive lines are typically referred to as metal layers (e.g., metal 1, metal 2, metal 3, etc.) and the dielectric layers are typically referred to as interlevel dielectric layers (ILD0, ILD1, ILD2, etc.). Copper lined films are being considered for use in metal layers due to their resistivity and resistance to electromigration.

Conductive lines and metal layers are discussed in U.S. Pat. Nos. 5,646,448; 5,770,519; and 5,639,691; each of which are assigned to the assignee of the present application. Generally, barrier layers are utilized with copper containing conductive structures to prevent copper diffusion into silicon substrates and insulative layers. Copper diffusion into silicon substrate degrades device integrity ("poison" the device) as well as the copper structure. Similarly, copper diffusion into insulative structures degrades performance of the insulative layers, as well as the copper structure.

Conventionally, barrier layers, such as silicon nitride have been utilized between the copper structure and the substrate and insulative layer. However, the interface between the silicon nitride material and the copper structure can be poor if the silicon nitride material is not processed properly. For example, chemical vapor deposited (CVD) silicon nitride must be pre-treated to ensure a proper interface. CVD silicon nitride without pre-treatment results in a poor Cu/SiN interface and possible delamination of the copper from the silicon nitride. Delamination creates a path from which copper ions can diffuse outward and to which moisture and other contaminates can diffuse inward. U.S. Pat. No. 6,271,595 discusses compounds which can be applied to copper surfaces to increase adhesion between copper and silicon nitride.

Thus, there is a need for an improved interface adhesion between silicon nitride and copper. Further, there is a need for a method of forming a metal interface layer between silicon nitride and copper. Even further, there is a need for a method of adding a metal organic precursor before silicon nitride chemical vapor deposition (CVD) to improve the silicon nitride interface.

SUMMARY OF THE INVENTION

An exemplary embodiment is related to a method of forming a metal layer interface between a copper layer and a silicon nitride layer. This method can include providing a metal organic gas over a copper layer, forming a metal layer from reactions between the metal organic gas and the copper layer, and depositing a silicon nitride layer over the metal layer and copper layer. The metal layer can provide an interface adhesion between the silicon nitride layer and the copper layer.

Another exemplary embodiment is related to a method of improving a silicon nitride and copper interface using added elements. The method can include providing a copper layer over an integrated circuit substrate, depositing added elements in a metal organic gas over the copper layer where the added elements react to copper in the copper layer and form a metal layer on top of the copper layer, and depositing silicon nitride over the metal layer and copper layer.

Another exemplary embodiment is related to a method of forming a via in an integrated circuit. This method can include depositing a copper layer, depositing an etch stop layer over the copper layer, depositing an insulating layer over the etch stop layer, forming an aperture in the insulating layer and the etch stop layer, depositing added elements in a metal organic gas over the copper layer where the added elements react to copper in the copper layer to form a metal layer on top of the copper layer, and depositing silicon nitride over the metal layer and copper layer.

Other principle features and advantages of the invention will become apparent to those skilled in the art upon review of the following drawings, the detailed description, and the appended claims.

BRIEF DESCRIPTION OF THE DRAWINGS

The exemplary embodiments will hereafter be described with reference to the accompanying drawings, wherein like numerals denote like elements, and.

DETAILED DESCRIPTION OF THE EXEMPLARY EMBODIMENTS

Figure 1:
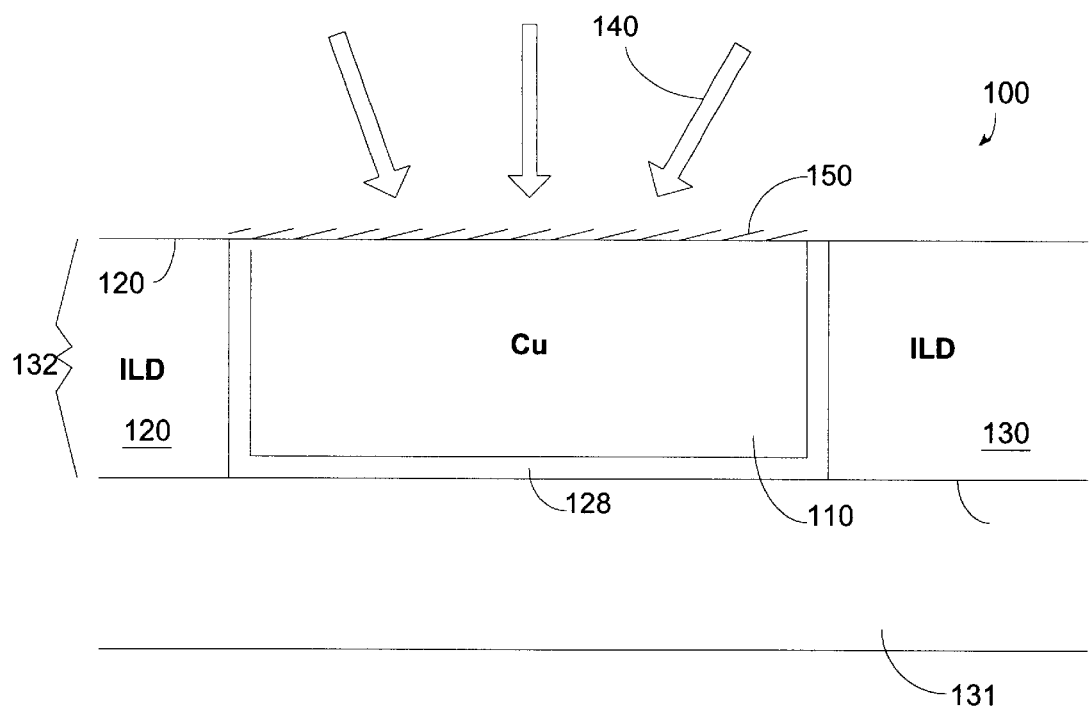
FIG. 1 is a schematic cross-sectional view representation of a portion of an integrated circuit, showing metal organic gas provided over a copper layer.

With reference to FIG. 1, a schematic cross-sectional view representation of a portion 100 of an integrated circuit (IC) includes a metal layer 132. Metal layer 132 can be a metal 1 layer, a metal 2 layer or any interconnect layer used in an integrated circuit. Metal layer 132 includes a copper interconnect layer, or line 110, an interlevel dielectric (ILD) material 120, an interlevel dielectric (ILD) material 130, and a barrier structure 128. Metal layer 132 can be provided above an interlevel dielectric layer 131. Layer 131 can correspond to an ILD layer 0, an ILD layer 1, or any insulative layer used in an integrated circuit.

Layer 131 is preferably a 2000 to 7000 Angstroms thick (TEOS) deposited silicon oxide layer. Alternatively, layer 131 can be a low-k dielectric material. Portion 100 is preferably part of an ultra-large-scale integrated (ULSI) circuit having millions or more transistors. Portion 100 is manufactured as part of the integrated circuit on a semiconductor wafer, such as, a silicon wafer.

Copper line 110 can be a layer including copper or a copper alloy. Copper line 110 can be deposited by ECP, CVD or PVD and formed according to a damascene technique. In an exemplary embodiment, copper line 110 has a thickness of 2000 to 7000 Angstroms. Interlevel dielectric materials 120 and 130 can include dielectric materials, such as oxide or nitride. Interlevel dielectric materials 120 and 130 can be deposited by CVD or spin-on and have a thickness of 2000 to 7000 Angstroms.

Copper line 110 is preferably provided in a U-shaped barrier structure 128. Barrier structure 128 is preferably a 40 to 400 Angstroms thick layer of titanium or tantalum deposited by PVD or CVD. Alternatively, structure 128 can be TiN, TaN, W, WN or other Cu barrier metals. Moreover, barrier structure 128 can also include any dielectric Cu barrier materials, such as SiC or SiN deposited by PVD or CVD.

After copper line 110 is formed and is situated between materials 120 and 130, a metal organic gas or metal/metal nitride deposition gas 140 can be provided to a surface 150 of portion 100. Preferably, metal organic gas or metal/metal nitride deposition gas 140 can include precursors elements, such as Ta, W, Mo, Cr, Zr, Mn, Co, Ni, Ag, Au, Sn, Mg, Ca, Ba, Al, Ti, Sr, or Cu. Metal organic gas or metal/metal nitride deposition 140 can be provided before a chemical vapor deposition (CVD) of silicon nitride (SiN). In an exemplary embodiment, metal organic gas or metal/metal nitride deposition 140 is provided as a vapor in a vacuum chamber 400 degrees Celsius. The time for this process can be from 1 to 100 seconds at a temperature from 200 to 700° C. This process is preferably done in the same process chamber as the subsequent SiN deposition (in-situ). However, it can also be done in other CVD or PVD chambers (ex-situ). A plasma power can be applied to enhance chemical reaction for the metal organic gas or metal/metal nitride deposition gases with surface 150 or with other process gasses (e.g., H, N, NH3). In an exemplary embodiment, the plasma can be a 13.56 MHz RF source with 0 to 500 W power, with or without Ar or He.

Depending on the precursor, the gas flow rate can be in the range of 5 to 1000 sccm. By the way of example, precursor dimethylethylamine alane can be used for Al deposition. Also as examples, precursors such as Cu 1 (tmvs) (hfac), described in Proceedings of IEEE International Reliability Physics Symposium 1997, pp. 201–205, or a CupraSelect precursor can be used in the above process to form a thin Cu layer with a better adhesion to the SiN (in-situ). A precursor, such as tetrakis(diethylamino)titanium (TDEAT) and tetrakis(dimethylamino)titanium (TDMAT), can be used to form Ti or TiN layer. Other metal nitride precursors include, by way of example, Tris(dimethylamino)alane for AlN, Tris(dimethylamino)borane for BN, Tetrakis(diethylamino) tin for SnN, Tetrakis(diethylamino)zirconium and Tetrakis (dimethylamino)zirconium for ZrN, etc. Other possible precursors include SiH4, GeH4, AlH3(NMe3)2, NH3, PH3, TiCl4, TaCl5, MoF6, WF6, SiHMe3, AlMe3, AliBu3, Ti(CH2tBu)4, Ti(NMe2)4, Cr(NEt2)4, Cu(acac)2, Pt(hfac)2 etc.

Metal organic gas or metal/metal nitride deposition gas 140 can include precursor elements that react with surface 150 of copper line 110 to form a thin metal or metal nitride layer 160 (FIG. 2) or 140 to react with other process gasses (H, N, NH3 for examples) to deposit a thin metal or metal nitride layer 160 on 150. Preferred precursor elements include Ta, TaN, Ti, TiN, W, WN. However, precursor elements could also include, Mo, Cr, Zr, Mn, Co, Ni, Ag, Au, Sn, Mg, Ca, Ba, Al, Sr, or Cu or their nitrides. By way of example, thin metal or metal nitride layer 160 can be 10 to 100 Angstroms thick. The metal or metal nitride layer can improve the interface adhesion between copper line 110 and silicon nitride layer 170 (FIG. 2), and therefore improving Cu line electrical and electromigration performances.

Figure 2:
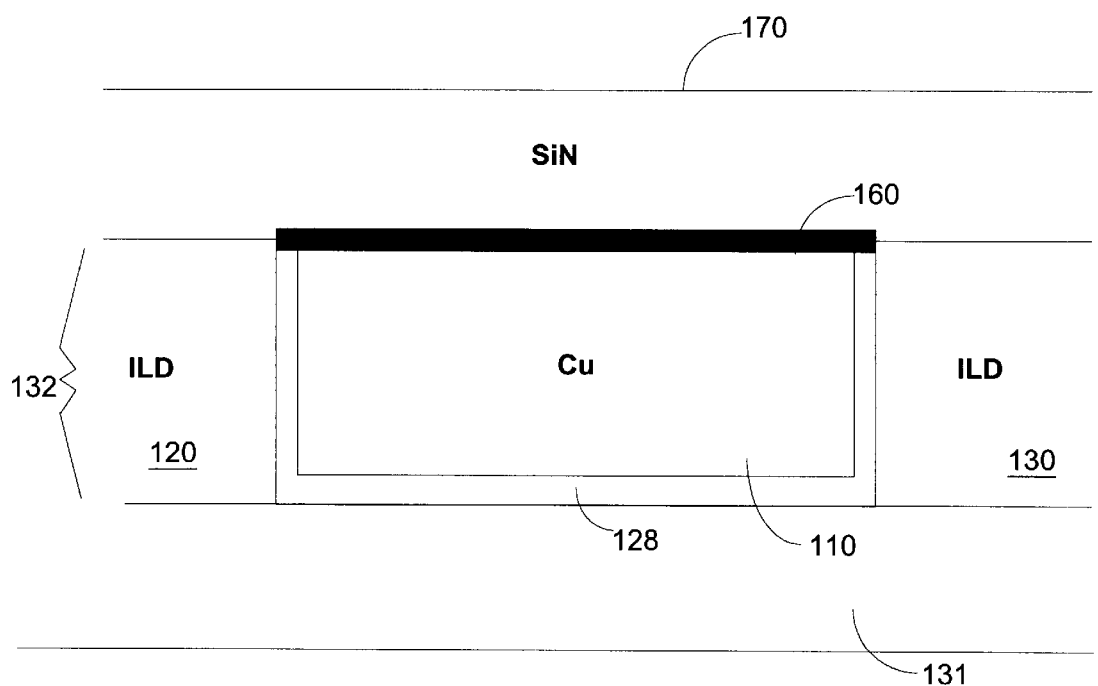
FIG. 2 is a schematic cross-sectional view representation of a portion of an integrated circuit, showing a metal layer intermediate silicon nitride and copper.

FIG. 2 illustrates portion 100 described with reference to FIG. 1 with the addition of a thin metal layer 160 on copper line 110 and a silicon nitride layer 170 over thin metal layer 160. In an exemplary embodiment, silicon nitride layer 170 can have a thickness of 200 to 700 Angstroms and is deposited by PE-CVD. After silicon nitride layer 170 is provided, an insulative layer similar to layer 131 can be provided over layer 170.

Advantageously, thin metal layer 160 improves the interface between copper layer 110 and silicon nitride layer 170. Further, thin metal layer 160 improves electromigration reliability and, thus, integrated circuit device performance.

While the exemplary embodiments illustrated in the FIGURES and described above are presently preferred, it should be understood that these embodiments are offered by way of example only. Other embodiments may include, for example, different precursor elements and different methods of forming a thin metal layer on a copper layer. The invention is not limited to a particular embodiment, but extends to various modifications, combinations, and permutations that nevertheless fall within the scope and spirit of the appended claims.

What is claimed is:

1. A method of forming a metal layer interface between a copper layer and a silicon nitride layer, the method comprising:

providing a metal organic gas over a copper layer;

forming a metal layer from reactions between the metal organic gas and the copper layer; and depositing a silicon nitride layer over the metal layer and copper layer, the metal layer providing an interface adhesion between the silicon nitride layer and the copper layer.

2. The method of claim 1, wherein the metal organic gas includes metal organic precursor elements.

3. The method of claim 1, wherein the metal organic precursor elements include magnesium (Mg), calcium (Ca), barium (Ba), aluminum (Al), titanium (Ti), or strontium (Sr).

4. The method of claim 1, wherein the metal layer is a metal nitride layer.

5. The method of claim 1, wherein forming a metal layer includes annealing the copper layer at 400° C.

6. The method of claim 1, wherein providing a metal organic gas over a copper layer is done in a vacuum chamber.

7. The method of claim 1, wherein depositing a silicon nitride layer over the metal layer and copper layer includes performing a chemical vapor deposition (CVD) of silicon nitride.

8. The method of claim 1, wherein the metal layer includes Al, Cu, Ag, Au.

9. A method of improving a silicon nitride and copper interface using added elements, the method comprising:
   providing a copper layer over an integrated circuit substrate;
   depositing added elements in a metal organic gas over the copper layer, the added elements reacting to copper in the copper layer to form a metal layer on top of the copper layer; and
   depositing silicon nitride over the metal layer and copper layer.

10. The method of claim 9, wherein the metal layer has a thickness of approximately 10 Angstroms.

11. The method of claim 9, wherein the added elements include magnesium (Mg), calcium (Ca), barium (Ba), aluminum (Al), titanium (Ti), or strontium (Sr).

12. The method of claim 9, wherein the metal organic gas is a metal nitride precusor.

13. The method of claim 9, wherein the silicon nitride is a via.

14. The method of claim 9, further comprising annealing the copper layer to form the metal layer.

15. A method of forming a via in an integrated circuit, the method comprising:
   depositing a copper layer;
   depositing an etch stop layer over the copper layer;
   depositing an insulating layer over the etch stop layer;
   forming an aperture in the insulating layer and the etch stop layer;
   depositing added elements in a metal organic gas over the copper layer, the added elements reacting to copper in the copper layer to form a metal layer on top of the copper layer; and
   depositing silicon nitride over the metal layer and copper layer.

16. The method of claim 15, wherein the metal layer has a thickness of approximately 10 Angstroms.

17. The method of claim 15, wherein the added elements include magnesium (Mg), calcium (Ca), barium (Ba), aluminum (Al), titanium (Ti), orstrontium (Sr).

18. The method of claim 15, wherein depositing added elements in a metal organic gas over the copper layer is done in a vacuum chamber.

19. The method of claim 15, wherein depositing silicon nitride over the metal layer and copper layer includes performing a chemical vapor deposition (CVD) of silicon nitride.

20. The method of claim 15, wherein the metal organic gas is a metal nitride precursor and the metal layer is a metal nitride layer.

* * * * *